(12) United States Patent
Subramanian et al.

(10) Patent No.: US 6,191,030 B1
(45) Date of Patent: Feb. 20, 2001

(54) ANTI-REFLECTIVE COATING LAYER FOR SEMICONDUCTOR DEVICE

(75) Inventors: Ramkumar Subramanian, San Jose; Suzette K. Pangrle, Cupertino, both of CA (US); John G. Pellerin, Austin, TX (US); Ernesto A. Gallardo, San Jose, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/434,441

(22) Filed: Nov. 5, 1999

Related U.S. Application Data

(62) Division of application No. 09/059,420, filed on Apr. 14, 1998, now Pat. No. 5,986,344.

(51) Int. Cl.⁷ .............................................. H01L 21/4763
(52) U.S. Cl. .................. 438/636; 438/624; 438/634; 438/637; 438/671; 438/952
(58) Field of Search ...................... 438/624, 634, 438/636, 637, 671, 952

(56) References Cited

U.S. PATENT DOCUMENTS

| | | | |
|---|---|---|---|
| 4,542,257 | 9/1985 | Fraser et al. | 136/251 |
| 4,723,197 | 2/1988 | Takiar et al. | 361/403 |
| 4,910,122 | 3/1990 | Arnold et al. | 430/313 |
| 5,127,964 | 7/1992 | Hamakawa et al. | 136/256 |
| 5,275,913 | 1/1994 | Lin | 430/252 |
| 5,308,742 | 5/1994 | Ta | 430/313 |
| 5,413,953 | 5/1995 | Chien et al. | 437/69 |
| 5,442,237 | 8/1995 | Hughes et al. | 257/759 |
| 5,472,913 | 12/1995 | Havemann et al. | 437/195 |
| 5,554,845 | 9/1996 | Dichiara et al. | 430/271.1 |
| 5,597,868 | 1/1997 | Kunz et al. | 525/154 |
| 5,665,641 | 9/1997 | Shen et al. | 438/643 |
| 5,760,483 | 6/1998 | Bruce et al. | 257/797 |
| 5,827,437 | 10/1998 | Yang et al. | 216/77 |
| 5,851,894 | 12/1998 | Ramm et al. | 438/311 |

OTHER PUBLICATIONS

K.S.Y. Lau et al.; "Chemistry and Thermomechanical Characterization of FLARE, A Low Dielectric Constant Organic Polymer Intermetal Dielectric".
The Electrochemical Society; 189th Meeting; May 5–10, 1996 (Abstract).
Internet Web Site Article; www.alliedsignal.com; "Electronic Materials"; retrieved Mar. 1998.

*Primary Examiner*—John F. Niebling
*Assistant Examiner*—David A. Zarneke
(74) *Attorney, Agent, or Firm*—Foley & Lardner (57) ABSTRACT

In a photo-lithographic step for providing contact points to lower layers of a semiconductor device, an anti-reflective coating (ARC) layer, such as FLARE 2.0™, is used to provide a good contact points to an underlayer. After the contact points are made, the anti-reflective coating layer is removed, with the removal being performed in a same step in which a photo-resist is removed from the semiconductor device. In an alternative configuration, the ARC layer remains in the semiconductor device after the fabrication process is competed, thereby acting as an interlayer dielectric during operation of the semiconductor device.

7 Claims, 10 Drawing Sheets

| | | | | 8K TEOS ONLY | | | | | |
|---|---|---|---|---|---|---|---|---|---|
| -0.6 | | 0.277 | 0.330 | NA | NA | NA | NA | NA | |
| -0.4 | 0.304 | 0.301 | 0.319 | 0.331 | 0.339 | 0.346 | 0.368 | 0.385 | NA |
| -0.2 | 0.320 | 0.328 | 0.326 | 0.341 | 0.347 | 0.347 | 0.360 | 0.371 | 0.399 |
| 0.0 | 0.300 | 0.324 | 0.330 | 0.346 | 0.344 | 0.364 | 0.360 | 0.345 | 0.396 |
| 0.2 | 0.326 | 0.311 | 0.322 | 0.341 | 0.342 | 0.366 | 0.376 | 0.386 | 0.223 |
| 0.4 | 0.330 | NA | NA | NA | NA | NA | NA | NA | NA |
| 0.6 | | NA | NA | NA | NA | NA | NA | NA | |
| FOCUS (MICRONS) | 19 | 20 | 21 | 22 | 23 | 24 | 25 | 26 | 27 |
| DOSE (mj) | | | | | | | | | |

ANTI-REFLECTIVE COATING LAYER FOR SEMICONDUCTOR DEVICE

This application is a division of Ser. No. 09/059,420 filed Apr. 14, 1998 now U.S. Pat. No. 5,986,344.

BACKGROUND OF THE INVENTION

1. Field of the Invention

The present invention relates to an apparatus and a method for patterning a semiconductor device. In particular, the present invention relates to an apparatus and a method for patterning a semiconductor device using an anti-reflective coating layer.

2. Description of the Related Art

Figure 1:
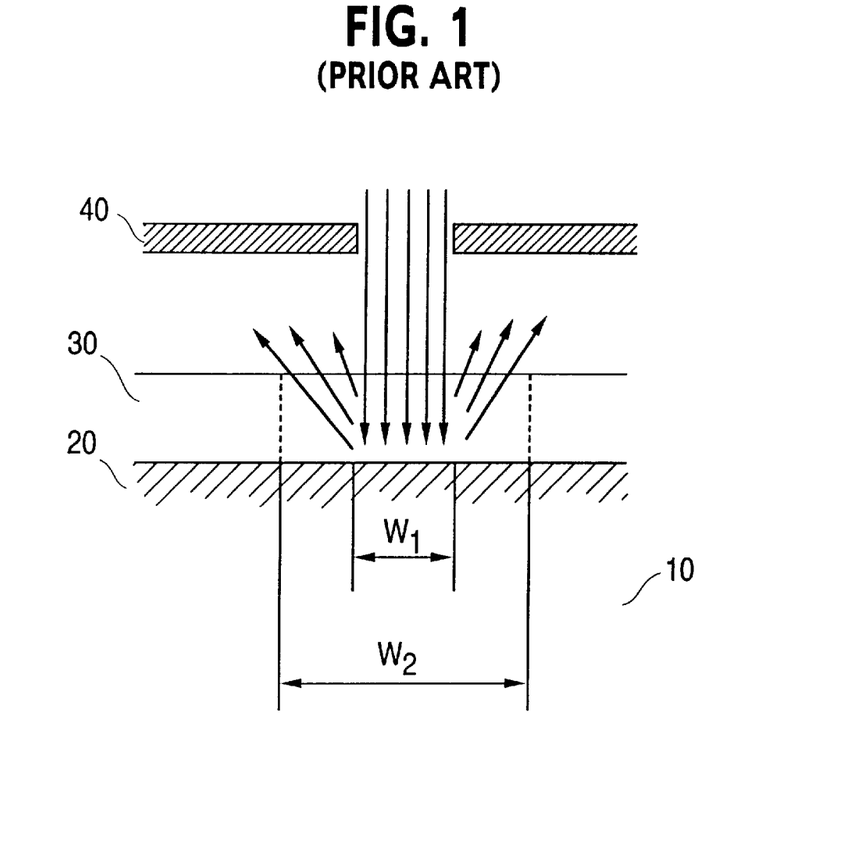
FIG. 1 is a diagram showing light scattering that occurs during a conventional lithographic process used to pattern a photo-resist layer.

As semiconductor device sizes shrink, the formation of accurately-sized contact regions using lithographic images becomes more important. Conventional lithographic techniques involve depositing an underlayer, such as a metal film layer 20, onto a semiconductor substrate 10. A metal film layer 20 is shown in FIG. 1. Then, a photo-resist (or resist) layer 30 is spin-coated onto the underlayer 20. The photo-resist layer 30 is then patterned using a conventional patterning. For example, as shown in FIG. 1, light is shined down onto the semiconductor substrate 10 from above, using a photo-lithographic mask (or reticle) 40, in order to pattern the photo-resist layer 30 to a desired pattern. The photo-lithographic mask 40 is constructed, for example, with a glass plate and with a chromium metal layer disposed onto portions of the glass plate where a photo-resist layer, which is situated between the mask 40 and a substrate, is not to be exposed to light from the light source.

Figure 2:
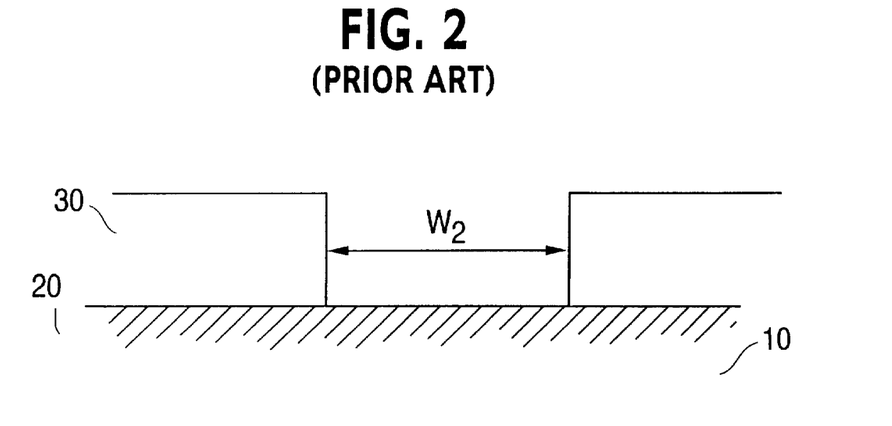
FIG. 2 is a diagram showing a gap formed in a photo-resist layer using the conventional lithographic process.

As shown in FIG. 1, the reticle 40 has a width of W1, which is the desired size of a gap to be placed in the photo-resist layer 30, so as to provide a contact region or the like to the underlayer 20. However, due to reflections of light from the top surface of the underlayer 20, some of the light reflects upwards and in a skewed direction, thereby exposing more of the photo-resist layer 30 to the light than is desired. This problem has been found by the inventors, and results in an "exposed" photo-resist width of W2, which is greater than the desired width of W1. FIG. 2 shows the result of the problems caused by the reflected light during the photo-lithographic step, in which a gap of W2 is formed in the photo-resist layer 30 after developing of the photoresist due to the light being exposed onto it, with the actually-obtained gap having a width of W2 that is larger than the desired gap of W1.

Thus, in the conventional photo-lithographic process, contact points made for an underlayer can sometimes be larger than desired, due to unwanted reflections of light during the patterning of the photo-resist. This is undesirable, and can result in defective operation of semiconductor devices.

SUMMARY OF THE INVENTION

An object of the present invention is to provide a method of creating a contact region to an underlayer of a semiconductor device, where the contact region is substantially uniform in size.

Another object of the present invention is to provide an apparatus for causing less light to reflect during a photo-lithographic step, to thereby obtain a contact region of a desired width.

To achieve these and other objects, the present invention is directed to a first method for creating a contact points to a lower layer of a semiconductor device. The method includes a step of applying an anti-reflective coating onto the lower layer. The method also includes a step of applying a resist onto the anti-reflective coating layer. The method further includes a step of patterning the resist to a particular pattern, with the patterning being performed by a photo-lithographic process using a mask. The method also includes a step of etching the anti-reflective coating layer in accordance with the particular pattern of the resist. The method further includes a step of etching the underlayer in accordance with the etched anti-reflective coating layer and the particular pattern formed on the resist layer. The method still further includes a step of removing the anti-reflective coating layer and the resist using a same etch-removal chemistry.

The present invention is also directed to a second method for creating a contact point to an underlayer of a semiconductor device. The method includes a step of applying an anti-reflective coating onto the lower layer. The method further includes a step of applying a silicon-based dielectric layer onto of the anti-reflective coating layer. The method also includes a step of applying a resist onto the silicon-based dielectric layer. The method further includes a step of patterning the resist to a particular pattern, with the patterning being performed by a photo-lithographic process using a mask. The method also includes a step of etching the silicon-based dielectric layer. The method also includes a step of etching the anti-reflective coating layer in accordance with the particular pattern of the resist. The method further includes a step of removing the resist layer. In an optional step, the silicon-based dielectric layer is removed. In the second method, unlike the first method, the anti-reflective coating layer remains on the semiconductor device after the manufacturing of the device, and serves and an interlayer dielectric during operation of the device, as well as serving as an anti-reflective layer during manufacturing of the device.

BRIEF DESCRIPTION OF THE DRAWINGS

The above-mentioned objects and advantages of the invention will become more fully apparent from the following detailed description when read in conjunction with the accompanying drawings, with like reference numerals indicating corresponding parts throughout, and wherein.

DETAILED DESCRIPTION OF THE PREFERRED EMBODIMENTS

Preferred embodiments of the present invention will be discussed in detail with reference to FIGS. 3A–12.

FIGS. 3A–3E show the steps involved in a method of creating a contact point to an underlayer, according to a first embodiment of the invention.

Figure 3A:
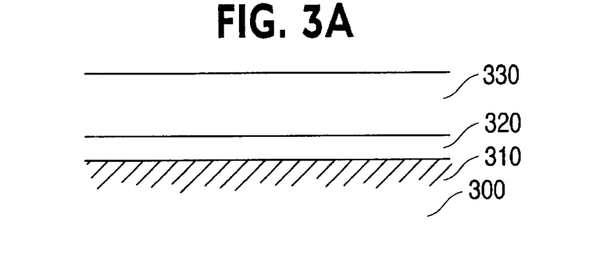
FIGS. 3A–3E show separate steps in the formation of a contact point for an underlayer of a semiconductor device according to a first embodiment of the invention.

In FIG. 3A, a semiconductor substrate 300 has an underlayer 310 disposed thereon. Underlayer 310 corresponds to a layer-to-be-patterned, and may be a metal film layer, such as an aluminum layer, a nitride layer, a metal-nitride layer, a silicon dioxide layer, a polysilicon (poly1 or poly2) layer, an oxide layer, or any other type of underlayer that needs to be patterned in order to construct a semiconductor device on the substrate 300.

Also shown in FIG. 3A is an anti-reflective coating (ARC) layer 320. In the first embodiment (and the second embodiment to be described below), the ARC layer 320 is a layer that comprises FLARE 2.0™, which is a substance made by Allied-Signal Corporation.

FLARE 2.0™ is conventionally used as an inter-layer dielectric for semiconductor devices, as described, for example, in an article entitled "Chemistry and Thermomechanical Characterization of FLARE, A Low Dielectric Constant organic Polymer Intermetal Dielectric", by K. S. Y. Lau et al., presented at the First International Symposium on Low and High Dielectric Constant Materials and Technology, May 5–10, 1996. FLARE 2.0™ is a chemical that comes in a liquid form. FLARE 2.0™ includes a polymer, which is poly(arylene ether). FLARE 2.0™ also includes other ingredients, the information on which Allied-Signal has not provided to the public and which they treat as proprietary information. In the present invention, FLARE 2.0™ is used for a different purpose than that contemplated by conventional uses of that compound, so as to achieve a better photo-lithographic processing and better contact points for an underlayer on a semiconductor substrate.

FLARE 2.0™ has optical characteristics that make it substantially anti-reflective, and that make it absorb much of the light that is incident upon it. This feature is important in creating better contact points for an underlayer of a semiconductor device by incorporating a sacrificial anti-reflective coating layer in the contact point creating process. The ARC layer 320 can be spin-coated, for example, onto the semiconductor device 300.

FIG. 3A also shows a photo-resist layer 330 that is disposed on top of the ARC layer 320. The photo-resist layer 330 can also be spin-coated, for example, onto the semiconductor device 300.

Figure 3B:
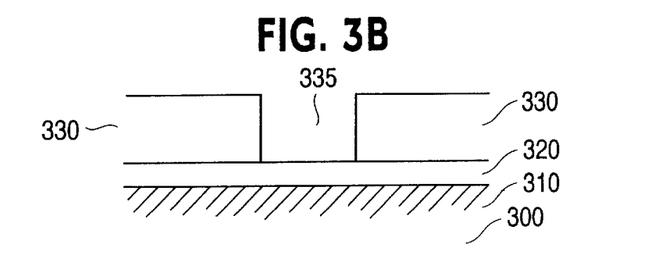

The structure as shown in FIG. 3A is similar to the conventional structure of a semiconductor device prior to a photo-lithographic step, but with an ARC layer 320 disposed between the photo-resist layer 330 and the underlayer 310. FIG. 3B shows the semiconductor device 300 after the photo-resist layer 330 has been patterned and developed using light shined onto the photo-resist layer 330 from above, as well as using a reticle (see FIG. 1, for example) to provide the desired patterning of the photo-resist layer 330. FIG. 3B shows a gap 335 formed within the photo-resist layer 330, with that gap 335 being a location where a contact point, or via hole, to the underlayer 310 is desired. Unlike the conventional process in forming a pattern on the photo-resist layer, light that is shined onto the photo-resist layer 330 from above and that passes through the photo-resist layer 330 is substantially absorbed by the ARC layer 320, and thus little if any light is reflected back off of the underlayer 310, thereby substantially solving the reflection problem discussed with respect to the conventional photo-lithographic processing step.

Figure 4:
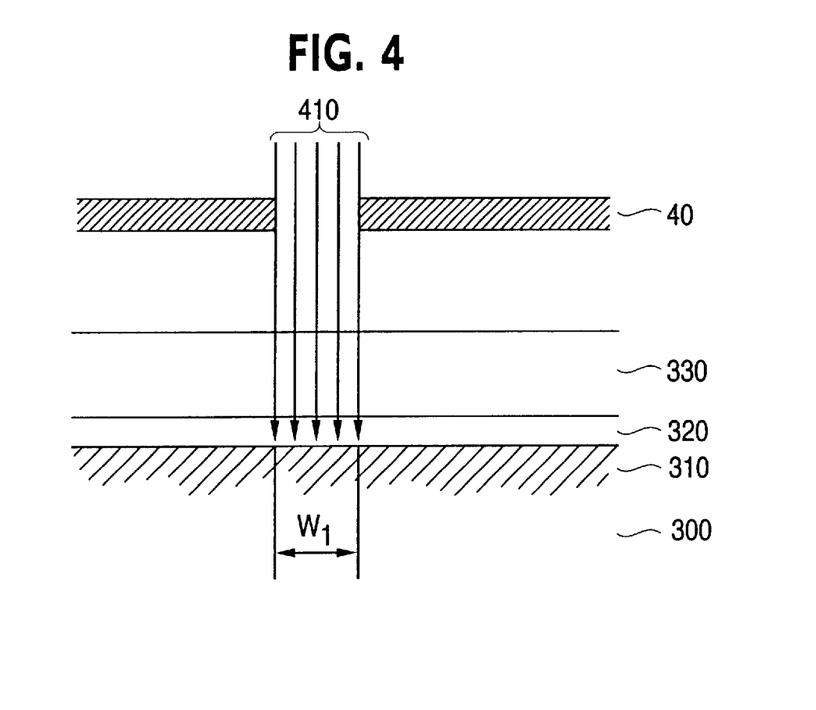
FIG. 4 shows light propagation during a lithographic process used to pattern a photo-resist layer according to the first embodiment of the invention.
Figure 5:
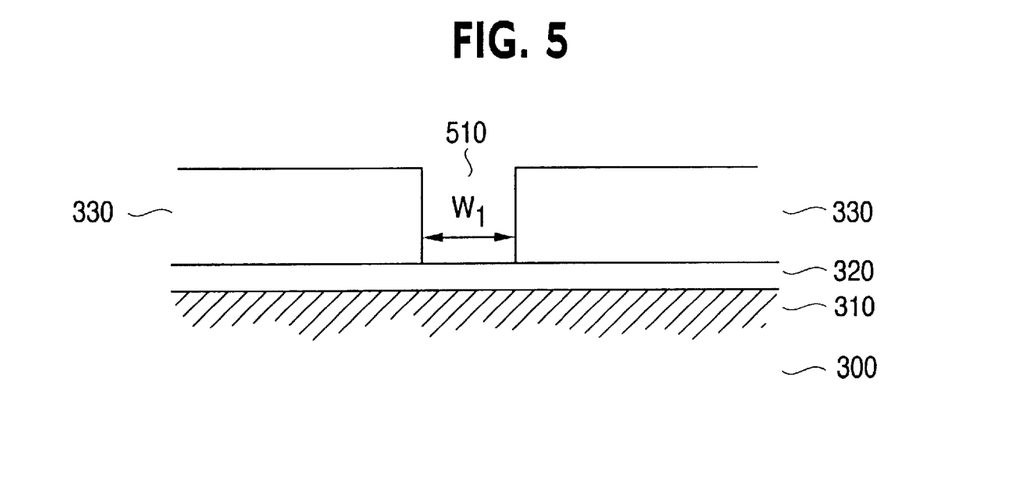
FIG. 5 is a diagram showing a gap formed in a photo-resist layer using the lithographic process according to the first embodiment of the invention.

FIG. 4 shows rays of light 410 that are provided to the photo-resist layer 330 from above, using a reticle 40, in a manner similar to that performed in the conventional photo-lithographic step shown in FIG. 1. However, unlike the conventional process, the rays of light 410 do not reflect off the top surface of the underlayer 310, and thus, as shown in FIG. 5, a gap 510 having a W1 that is substantially the same as the desired gap size is formed in the photo-resist layer 330. This is because only the desired portions of the photo-resist layer 330 are exposed to light by virtue of the reticle 40, and the ARC layer 320 that substantially lessens the amount of undesired reflected light.

Figure 3C:
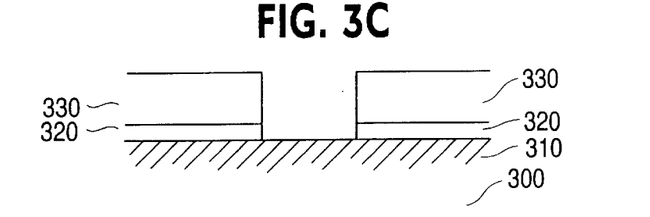

FIG. 3C shows the semiconductor device after an etching of the ARC layer 320. The etching of the ARC layer 320 may be performed, for example, by a dry etch using an $O_2$-containing plasma, so as to form a pattern in the ARC layer 320 that is similar to the pattern formed in the photo-resist layer 330. During the dry etch of the ARC layer 320, some portion of the photo-resist layer 330 may also be etched, resulting in a smaller-thickness photo-resist layer 330 than the thickness of that layer prior to the dry etch (compare with FIG. 3B). After the etching of the ARC layer 320 is completed, a "stencil" has effectively been created for the formation of contact points or vias in the underlayer 310 in desired locations, to be done in later steps in the method as explained below.

Figure 3D:
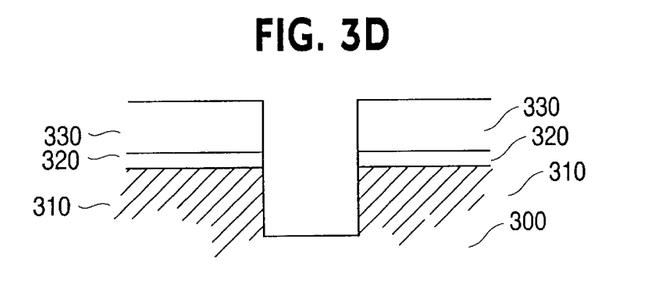

FIG. 3D shows the semiconductor device after an etching of the underlayer 310. The etching of the underlayer 310 is done with an etch process that is highly selective with respect to the photo-resist layer 330 and the ARC layer 320. For example, if the underlayer 310 is a metal layer, a fluorine-based gas etch (e.g., $C_2F_6$ or $C_3F_8$) may be performed to create a patterning of the underlayer 310 similar to the patterning of the layer above that layer. The fluorine-based gas etch is not effective in etching organic layers, such as the photo-resist layer 330 and the ARC layer 320, and thus does not change the structure of these layers very much if at all.

Figure 3E:
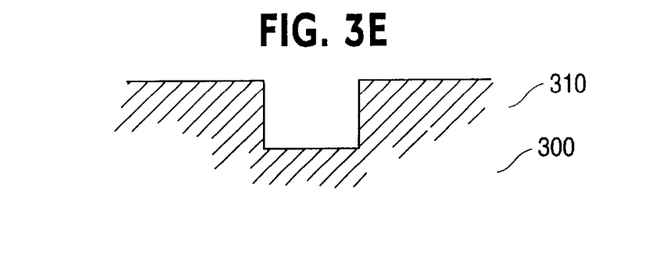

After the etching of the underlayer 310 is completed, the photo-resist layer 330 and the ARC layer 320 are then removed, to result in a structure as shown in FIG. 3E. In the first embodiment, since the photo-resist layer 330 and the ARC layer 320 are both layers made from organic materials, they can be etched away using a same etch chemistry in one step. For example, an etch chemistry such as an $O_2$-containing plasma may be used to etch away both the photo-resist layer 330 and the ARC layer 320 (etch performed for a long enough time to completely etch away these two layers), but while not affecting the underlayer 310, which is substantially etch-resistant to the Argon or the oxygen plasma.

In the first embodiment, the ARC layer 320 is a sacrificial layer that is used to improve the formation of contact regions to an underlayer of a semiconductor device, and is removed from the semiconductor device after the contact regions are formed. Thus, a semiconductor device manufactured according to first embodiment of the invention does not include an ARC layer disposed therein.

A second embodiment of the present invention is described below with reference to FIGS. 6A–6E. For a semiconductor device manufactured according to the second embodiment, an ARC layer remains on the semiconductor device after the manufacturing process is completed, whereby: a) the ARC layer provides an anti-reflective property during manufacturing in order to enhance the photolithographic process used to pattern a photo-resist layer disposed above the ARC layer, and b) the ARC layer provides an inter-layer dielectric (insulative) property during operation of the semiconductor device. In the second embodiment, the ARC layer is utilized as a permanent, insulating dielectric film in a multilevel interconnect structure of a semiconductor device.

Figure 6A:
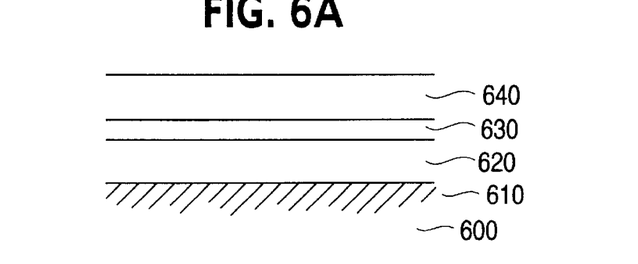
FIGS. 6A–6E show separate steps in the formation of a contact point for an underlayer of a semiconductor device according to a second embodiment of the invention.

FIG. 6A shows a semiconductor device 600 having an underlayer 610, an ARC layer 620, a silicon-based dielectric hardmask 630, and a photo-resist layer 640. The difference between the structure of FIG. 6A and the structure of FIG. 3A is the addition of the silicon-based dielectric hardmask 630 between the photo-resist layer 640 and the ARC layer 620. The hardmask 630 may be a silicon oxide layer ($SiO_2$), a silicon nitride layer ($Si_3N_4$), a silicon oxynitride layer, or other similar type of hardmask layer. The ARC layer 620 may be spin-coated, for example, onto the underlayer 610 of the semiconductor device 600. The silicon-based dielectric hardmask 630 may be applied onto the ARC layer 620 by any of a variety of known techniques for creating such a layer on a semiconductor device, such as by a chemical vapor deposition (CVD) process. The photo-resist layer 640 may be spin-coated, for example, onto the silicon-based dielectric hardmask 630.

Figure 6B:
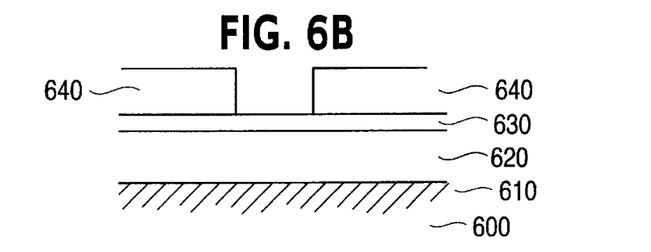

FIG. 6B shows the semiconductor device 600 after the photo-resist layer 640 has been patterned. The patterning of the photo-resist layer 640 is done by exposing and developing portions of the photo-resist layer 640 in a manner explained above with respect to FIG. 3B, FIG. 4 and FIG. 5. In this step, light shined onto the photo-resist layer 640 to expose portions of that layer is substantially absorbed by the ARC layer 620, thereby causing very little if any problems due to reflected light exposing areas of the photo-resist layer 640 that should not be exposed during the photolithographic step. While there may be some light reflected upwards by the hardmask layer 630, that amount of light is small enough so as not to cause problems in the photolithographic process, as shown by the experimental results given in FIGS. 9 and 10 (discussed below).

Figure 6C:
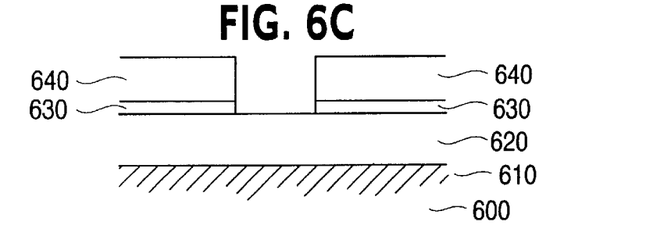

FIG. 6C shows the semiconductor device 600 after the silicon-based dielectric hardmask 630 has been patterned to have a substantially similar pattern to the pattern made on the photo-resist layer 640. Oxide layers and organic layers typically etch fundamentally different, and so an etch chemistry used to etch the hardmask 630 is substantially etch-resistant to the photo-resist layer 640 and the ARC layer 620, which are both organic layers. A typical etch chemistry that may be used to etch the inorganic hardmask 630 is a fluorine-based chemistry.

Figure 6D:
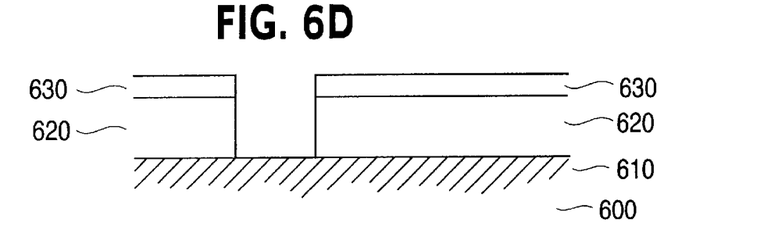

FIG. 6D shows the semiconductor device 600 after the ARC layer 620 has been patterned, where the patterning of the ARC layer 620 is done is a similar manner to that explained above with respect to FIG. 3C. The etching of the ARC layer 620 may be performed with an Argon or an oxygen-based plasma, for example. In the second embodiment, the entire organic photo-resist layer 640 is removed at the same time the organic ARC layer 620 is patterned with the Argon or oxygen plasma. This is done by using an etch chemistry for patterning the ARC layer 620 that also etches the photo-resist layer 640.

Figure 6E:
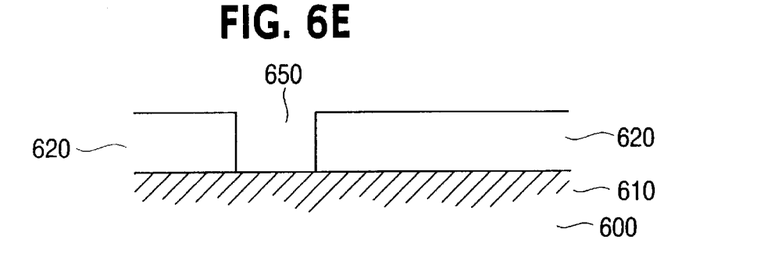

FIG. 6E shows the semiconductor device after the hardmask 630 has been removed, thereby leaving the ARC layer 620 as an interlayer dielectric. The removal of the hardmask 630 is performed with an etch chemistry, such as a fluorine-based chemistry, which is substantially etch-resistant to the ARC layer 620. If a metal layer (not shown) is disposed on top of the ARC layer 620 in a later fabrication step, a metal contact point will exist in a region 650 where the ARC layer 620 has been etched, but in all other places the ARC layer 620 will act as an isolation layer between the metal layer and the underlayer (which may also be a metal-based layer). In the second embodiment, the step of removing the hardmask 630 is optional, and the hardmask 630 may be kept on the semiconductor device 600 and together with the ARC layer 620 act as an interlayer dielectric.

In the second embodiment, unlike the first embodiment, the ARC layer 620 is not a sacrificial layer, but remains within the semiconductor device after the fabrication of the semiconductor device is complete. In this respect, the ARC layer 620 serves as an interlayer dielectric in a same manner as that contemplated by the use of FLARE 2.0™ in conventional semiconductor devices, but with the FLARE 2.0™ also serving as an ARC layer 620 to improve the photolithographic patterning of the photo-resist layer during manufacturing of the semiconductor device.

Figure 7:
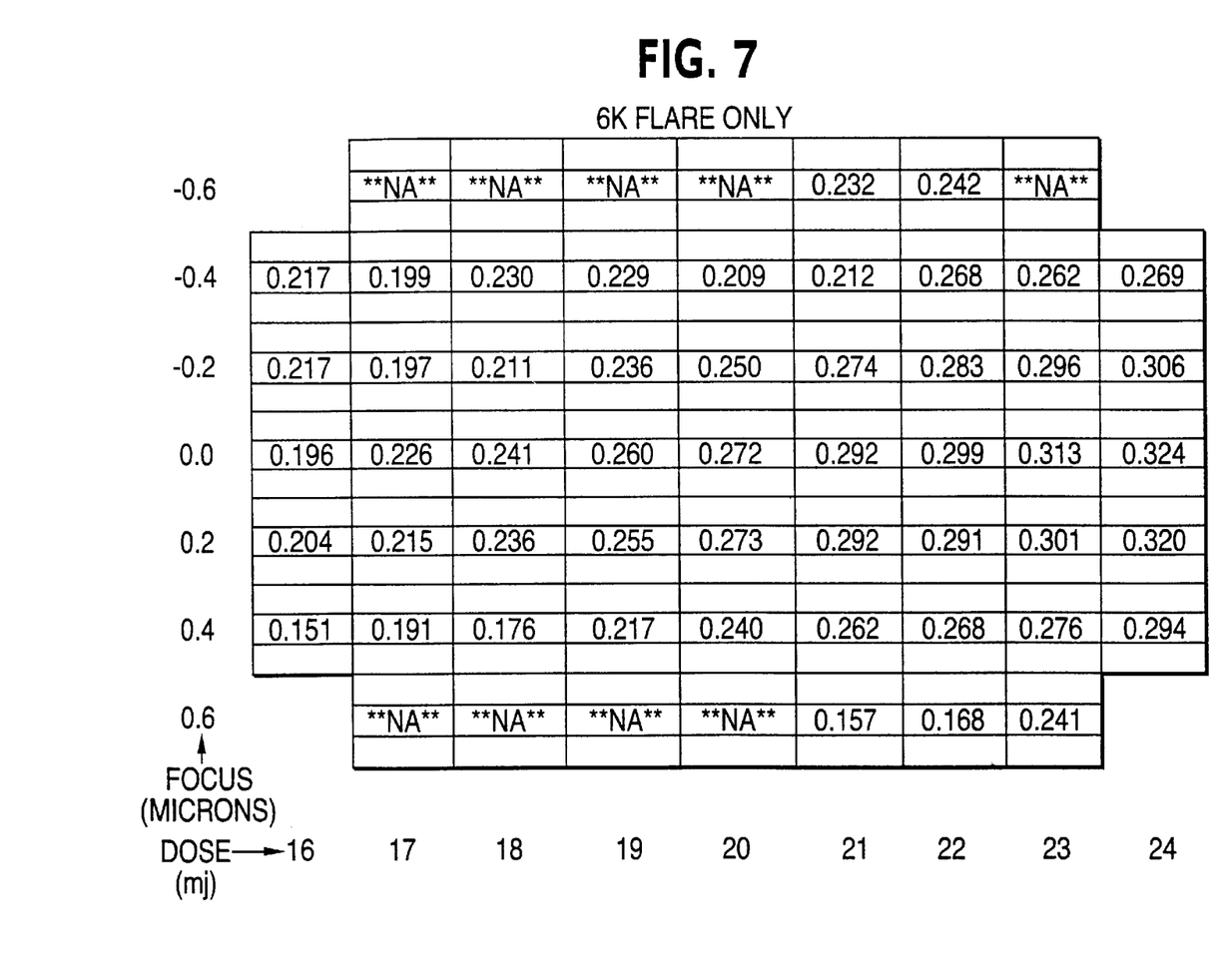
FIG. 7 is a diagram showing critical dimension values experimentally obtained for different focus and dose values used during a photo-lithographic step for fabrication of a semiconductor device according to the first embodiment of the invention.
Figure 8:
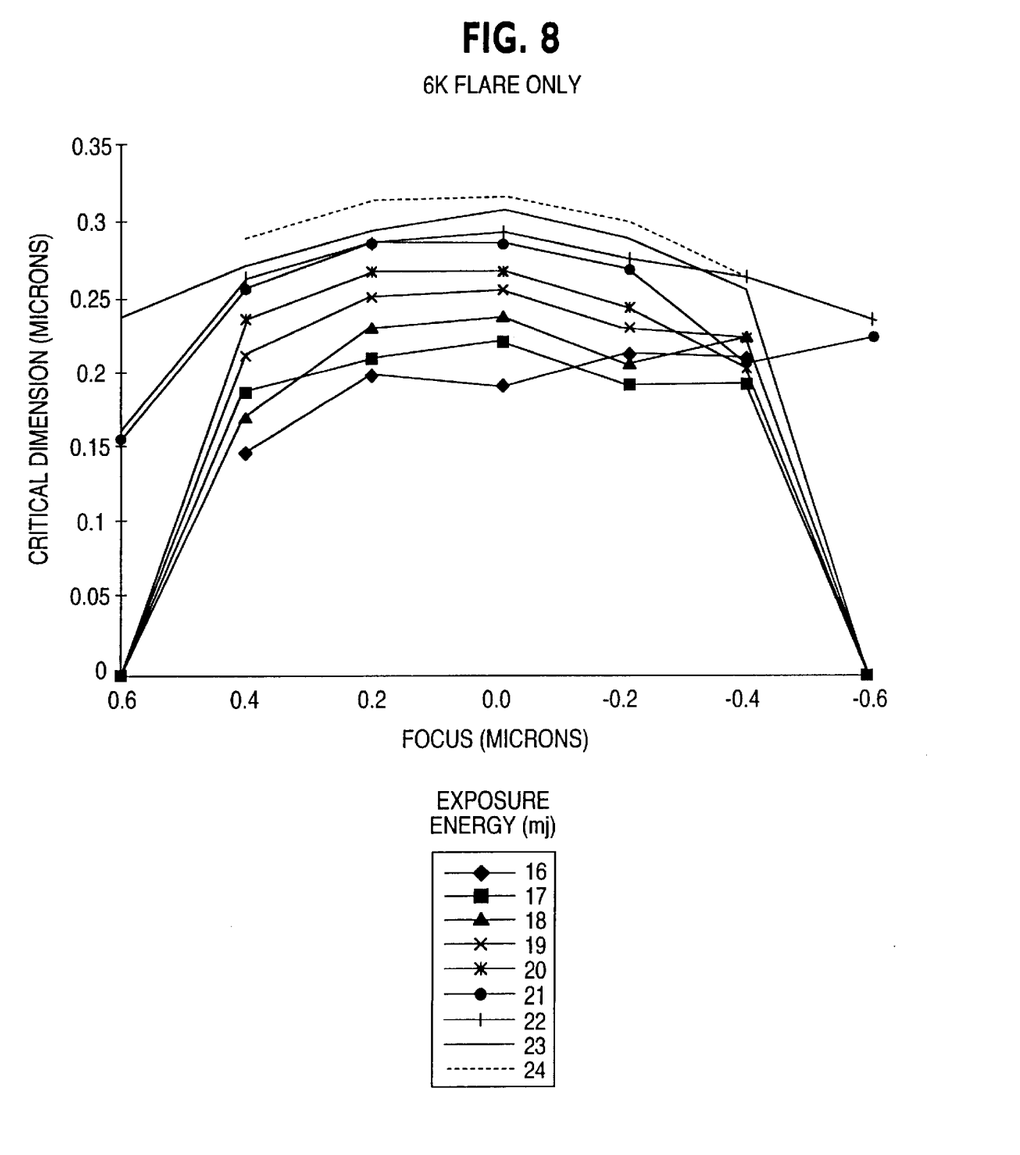
FIG. 8 is a plot of the critical dimension values of FIG. 7 for different focus and dose values.

FIG. 7 shows experimental results of a critical dimension value that varies based on different focus and dose used during a photo-lithographic step for a semiconductor device according to the first embodiment. FIG. 8 shows a plot of the values of FIG. 7. In particular, these figures show that a critical dimension value remains within a fairly narrow range over a wide range of focus values and dose values for light used during a photo-lithographic step.

Figure 9:
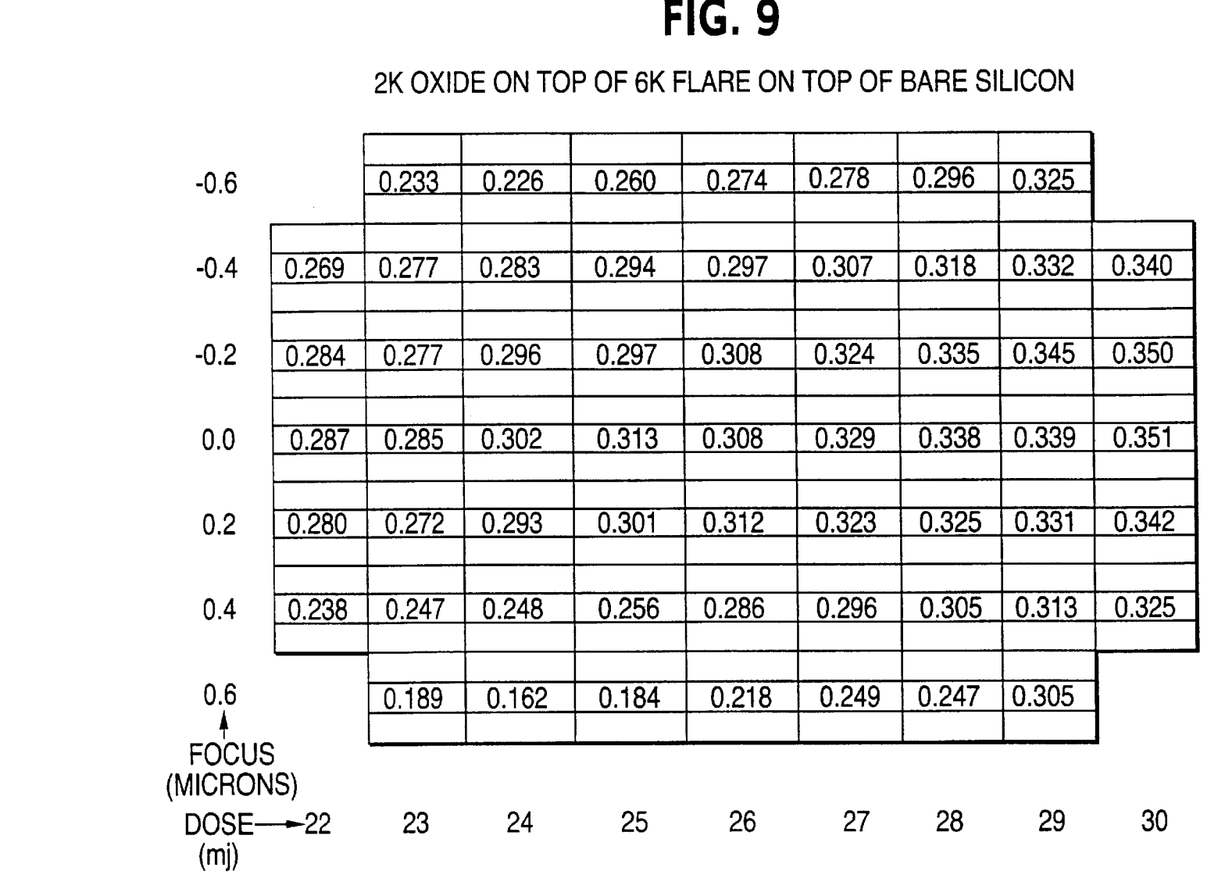
FIG. 9 is a diagram showing critical dimension values experimentally obtained for different focus and dose values used during a photo-lithographic step for fabrication of a semiconductor device according to the second embodiment of the invention.
Figure 10:
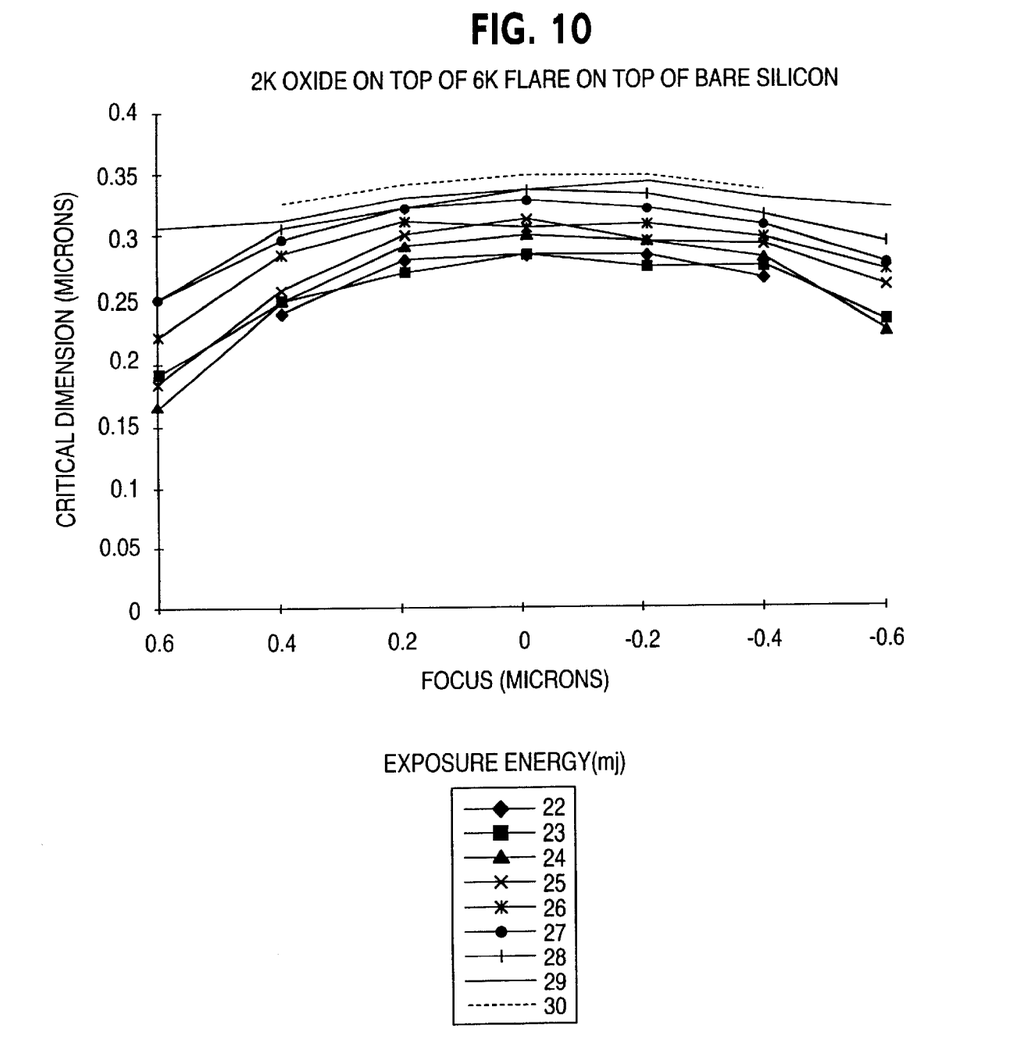
FIG. 10 is a plot of the critical dimension values of FIG. 9 for different focus and dose values.

FIG. 9 shows experimental results of a critical dimension value that varies based on different focus and dose used during a photo-lithographic step for a semiconductor device according to the second embodiment. FIG. 9 shows a plot of the values of FIG. 8. Like FIGS. 7 and 8, FIGS. 9 and 10 show that a critical dimension value remains within a fairly narrow range over a wide range of focus values and dose values for light used during a photo-lithographic step.

Figure 11:
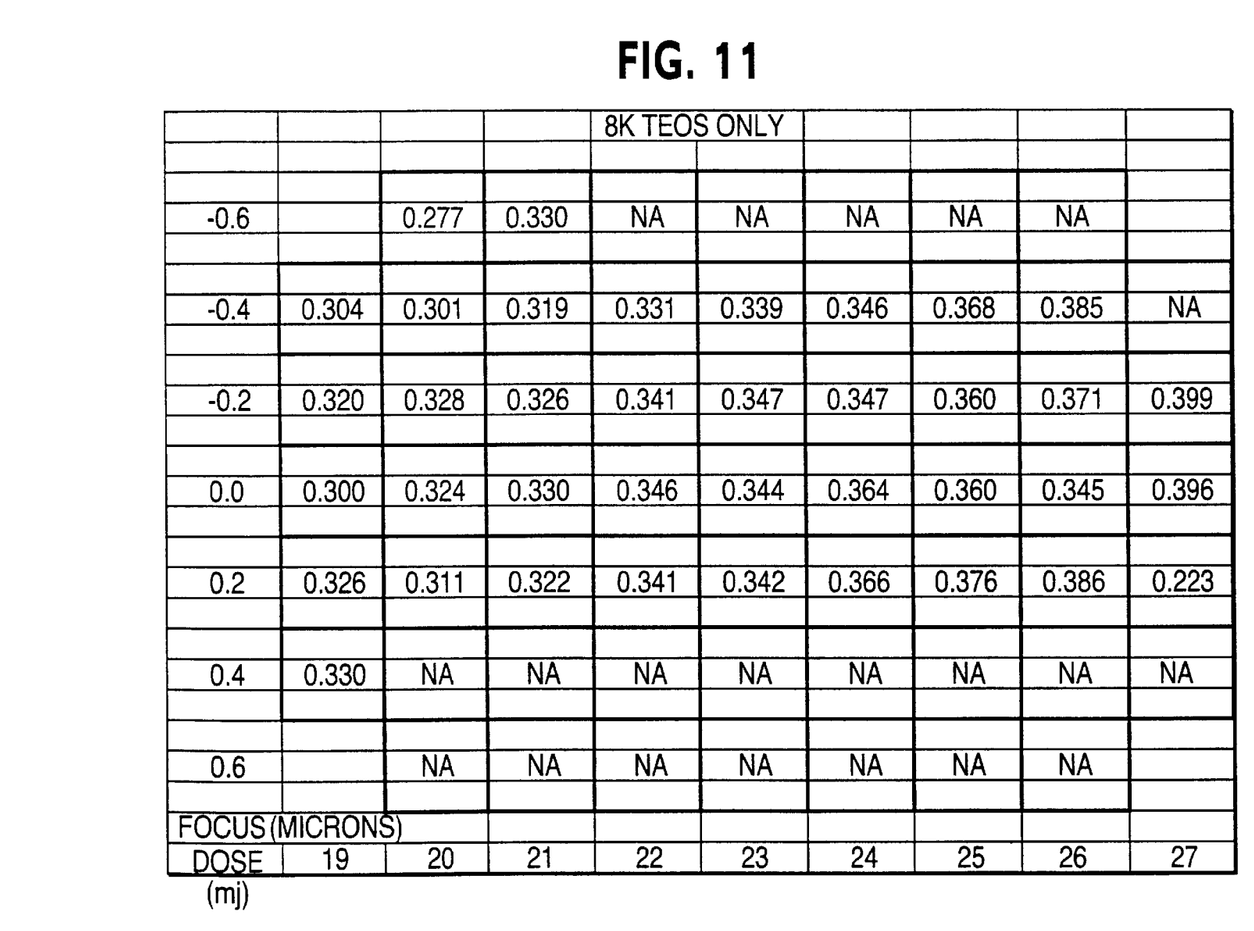
FIG. 11 is a diagram showing critical dimension values experimentally obtained for different focus and dose values used during a conventional photo-lithographic step for fabrication of a semiconductor device.
Figure 12:
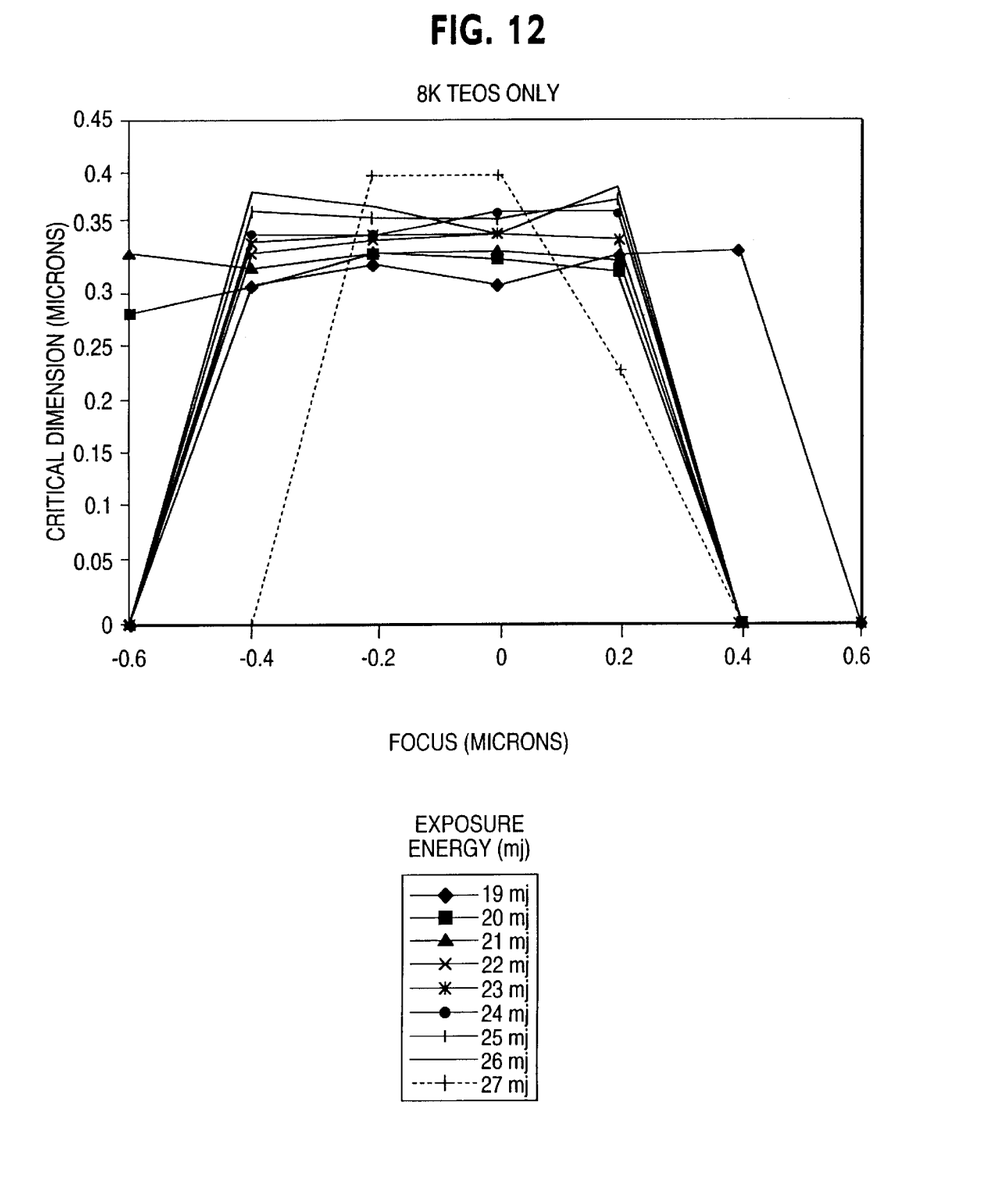
FIG. 12 is a plot of the critical dimension values of FIG. 11 for different focus and dose values.

FIG. 11 shows experimental results of a critical dimension value that varies based on different focus and dose used during a conventional photo-lithographic step for a semiconductor device that does not utilize FLARE2.0™ as an anti-reflective coating layer. FIG. 12 shows a plot of the values of FIG. 11. When compared to FIGS. 7–10, the critical dimension values obtained using the conventional photo-lithographic step vary over a wider range for different focus and dose values for light used during the conventional photo-lithographic step. Thus, the methods according to the first and second embodiments are preferable to the conventional photo-lithographic method in providing a more accurate critical dimension (e.g., width of contact region or depth of contact region) for a semiconductor device.

Table 1 shows reflectance values measured during a photo-lithographic step for a semiconductor device according to the first embodiment (6K FLARE™), the second embodiment (6K FLARE™+2K oxide layer), and a conventional semiconductor device (8K TEOS) that does not utilize an ARC layer during a photo-lithographic step. As can be seen from the values in Table 1, the reflectance is much less for the devices constructed according to the first and second embodiments, when compared against a conventionally-constructed device. These values were obtained using Deep UV light at 248 nm wavelength, which is used for patterning a semiconductor device. The thickness of the FLARE layers are expressed in Angstroms (e.g., 6K FLARE™=6000 Angstroms in thickness).

TABLE 1

| | Reflectance Values | | | |
|---|---|---|---|---|
| Material | Max. | Min. | Average | Standard Dev. |
| 6K FLARE | 15.25 | 14.4 | 14.93 | 0.172 |
| 6K FLARE + 2K Oxide | 12.88 | 1.24 | 7.49 | 2.945 |
| 8K TEOS | 102.46 | 86.41 | 98.03 | 4.346 |

While embodiments have been described herein, modification of the described embodiments may become apparent to those of ordinary skill in the art, following the teachings of the invention, without departing from the scope of the invention as set forth in the appended claims.

For example, the first and second embodiments are described with reference to a compound known as Flare2.0™, which primarily includes a poly(arylene) ether, but other types of polymers that provide a similar anti-reflective coating property may be utilized while remaining within the scope of the invention.

What is claimed is:

1. A method of creating contact points to an underlayer of a semiconductor device, the method comprising the steps of:

applying an anti-reflective coating layer onto the underlayer;

applying a silicon-based dielectric hardmask onto the anti-reflective coating layer;

forming at least one via in the anti-reflective coating layer using a sacrificial photo-resist layer and a photo-lithographic process and the silicon-based dielectric hardmask, the at least one via having a first predetermined size in the anti-reflective coating layer and a second predetermined size in the silicon-based dielectric hardmask, the first predetermined size being equal to the second predetermined size, wherein the anti-reflective coating layer absorbs light during formation, in the manufacturing of the semiconductor device, of the at least one via in the silicon-based dielectric hardmask to thereby have a same size in both the anti-reflective coating layer and the silicon-based dielectric hardmask, wherein the anti-reflective coating layer and the silicon-based dielectric hardmask collectively form an interlayer dielectric between the underlayer and any metal layers disposed on the silicon-based dielectric hardmask during operation of the semiconductor device, wherein the silicon-based dielectric hardmask is one of a silicon oxide layer, a silicon nitride layer, and a silicon oxynitride layer, and wherein the anti-reflective coating layer is 6000 angstroms in thickness, and the silicon-based dielectric hardmask is 200 angstroms in thickness.

2. The method according to claim 1, further comprising the step of removing the anti-reflective coating layer and the resist using a same etch-removal chemistry.

3. The method according to claim 2, wherein the underlayer is a metal film layer.

4. A method of creating contact points to an underlayer of a semiconductor device, the method comprising the steps of:

applying an anti-reflective coating layer onto the underlayer;

applying a silicon-based dielectric layer onto the anti-reflective coating layer;

forming at least one via in the anti-reflective coating layer and the silicon-based dielectric layer, the at least one via having a first predetermined size in the anti-reflective coating layer and a second predetermined size in the silicon-based dielectric layer, the first predetermined size being equal to the second predetermined size, wherein the anti-reflective coating layer absorbs light during formation, in the manufacturing of the semiconductor device, of the at least one via in the silicon-based dielectric layer to thereby have a same size in both the anti-reflective coating layer and the silicon-based dielectric layer, wherein the anti-reflective coating layer and the silicon-based dielectric layer collectively form an interlayer dielectric between the underlayer and any metal layers disposed on the silicon-based dielectric layer during operation of the semiconductor device, wherein the silicon-based dielectric layer is one of a silicon oxide layer, a silicon nitride layer, and a silicon oxynitride layer, and wherein the anti-reflective coating layer is 6000 angstroms in thickness, and the silicon-based dielectric layer is 200 angstroms in thickness.

5. The method according to claim 4, further comprising the step of removing the silicon-based dielectric layer.

6. The method according to claim 4, wherein the underlayer is a metal film layer.

7. The method according to claim 4, wherein the anti-reflective coating layer remains on the semiconductor device after the manufacturing of the device, and serves and an interlayer dielectric during operation of the device.

* * * * *